United States Patent
Zhang et al.

(10) Patent No.: US 10,990,000 B2
(45) Date of Patent: Apr. 27, 2021

(54) PHOTOLITHOGRAPHY PLATE AND MASK CORRECTION METHOD

(71) Applicants: Semiconductor Manufacturing International (Shanghai) Corporation, Shanghai (CN); Semiconductor Manufacturing International (Beijing) Corporation, Beijing (CN)

(72) Inventors: Jiancheng Zhang, Shanghai (CN); Wei Wu, Shanghai (CN); Chenbo Zhang, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 209 days.

(21) Appl. No.: 16/100,417

(22) Filed: Aug. 10, 2018

(65) Prior Publication Data

US 2019/0179226 A1   Jun. 13, 2019

(30) Foreign Application Priority Data

Dec. 8, 2017   (CN) .......................... 201711292209.X (51) Int. Cl.
*G03F 1/72*   (2012.01)
*G03F 1/80*   (2012.01)
(Continued)

(52) U.S. Cl.
CPC .................. *G03F 1/36* (2013.01); *G03F 1/72* (2013.01); *G03F 1/80* (2013.01); *G03F 1/84* (2013.01)

(58) Field of Classification Search
CPC . G03F 1/74; G03F 1/08; G03F 1/0144; G03F 1/36; G03F 1/72; G03F 1/80; G03F 1/84; H01L 21/027
See application file for complete search history.

(56) References Cited

U.S. PATENT DOCUMENTS

| | | | | |
|---|---|---|---|---|
| 5,965,301 A | * | 10/1999 | Nara ......................... | G03F 1/74 |
| | | | | 430/5 |
| 2003/0007366 A1 | * | 1/2003 | Drummond ............. | H02M 3/28 |
| | | | | 363/17 |

(Continued)

FOREIGN PATENT DOCUMENTS

| | | | | |
|---|---|---|---|---|
| JP | 2008-003543 | * | 1/2008 | |
| JP | 2008-046624 | * | 2/2008 | |

(Continued)

OTHER PUBLICATIONS

Machine translation of KR20090047000 (2009).*
Machine translation of JP 2011-248483 (2011).*

*Primary Examiner* — Martin J Angebranndt
(74) *Attorney, Agent, or Firm* — Brinks Gilson & Lione (57) ABSTRACT

The present disclosure teaches a photolithography plate and a mask correction method, and relates to the field of semiconductor technologies. In forms of the mask correction method, a patterned mask is formed on a substrate, a location of a scattering bar embedded in the substrate is determined according to the mask, and an opening is formed at the determined location so as to embed the scattering bar in the opening. A scattering bar is embedded in a substrate of a photolithography plate so as to effectively avoid the impact of the scattering bar on a mask pattern, reduce a deposition loss, improve the correction effect, and shorten a correction time.

7 Claims, 6 Drawing Sheets

(51) Int. Cl.
*G03F 1/84* (2012.01)
*G03F 1/36* (2012.01)

(56) References Cited

U.S. PATENT DOCUMENTS

| | | | | |
|---|---|---|---|---|
| 2003/0008216 A1* | 1/2003 | Bula | ................... | G03F 1/36 |
| | | | | 430/5 |
| 2003/0203292 A1* | 10/2003 | Chen | ................... | G03F 1/72 |
| | | | | 430/5 |
| 2004/0151992 A1* | 8/2004 | Nagamura | ............... | G03F 1/74 |
| | | | | 430/5 |
| 2008/0090156 A1* | 4/2008 | Kim | ................... | G03F 1/46 |
| | | | | 430/5 |
| 2015/0364415 A1* | 12/2015 | Zhao | ................ | H01L 21/0274 |
| | | | | 257/774 |
| 2015/0364419 A1* | 12/2015 | Tran | ................ | H01L 23/5256 |
| | | | | 438/238 |
| 2019/0163051 A1* | 5/2019 | Chang | ................. | G03F 1/24 |

FOREIGN PATENT DOCUMENTS

| | | | | |
|---|---|---|---|---|
| JP | 2009-009058 | * | 1/2009 | |
| JP | 2011-128483 | * | 6/2011 | ........... H01L 21/027 |
| KR | 20090047000 | * | 6/2009 | ........... H01L 21/027 |

* cited by examiner

PHOTOLITHOGRAPHY PLATE AND MASK CORRECTION METHOD

RELATED APPLICATIONS

The present application claims priority to Chinese Patent Appln. No. 201711292209.X, filed Dec. 8, 2017, the entire disclosure of which is hereby incorporated by reference.

BACKGROUND

Technical Field

The present disclosure relates to the field of semiconductor technologies, and in particular, to a photolithography plate and a mask correction method.

Related Art

Integrated circuit manufacturing technology is a complex process with technology that rapidly advances. A critical parameter in integrated circuit manufacturing technology is a minimum feature dimension, that is, the critical dimension (CD). Because of reduction in the CD, each chip is possibly disposed with millions of devices.

A photolithography technology is a driving force for the development of an integrated circuit manufacturing process, and is also one of the most complex technologies. Compared with other single manufacturing technologies, the improvement of photolithography technology has an important meaning for the development of integrated circuits. Before a photolithography process is started, a pattern needs to be copied to a mask first using particular equipment, and then light with a particular wavelength generated by photolithography equipment is used to copy the pattern structure on the mask to a silicon slice for producing chips. However, because of reduction in a dimension of a semiconductor device, a distortion may occur in the process of transferring the pattern to the silicon slice. If the distortion is not eliminated, the entire manufacturing technology may fail.

Therefore, to resolve the problem, optical proximity correction (OPC) should be performed on the mask. The OPC method is to perform preprocessing before photolithography is performed on a photolithography mask, that is, perform pre-modification, so that a modified compensation amount can just compensate for an optical proximity effect caused by an exposure system.

Figure 1:
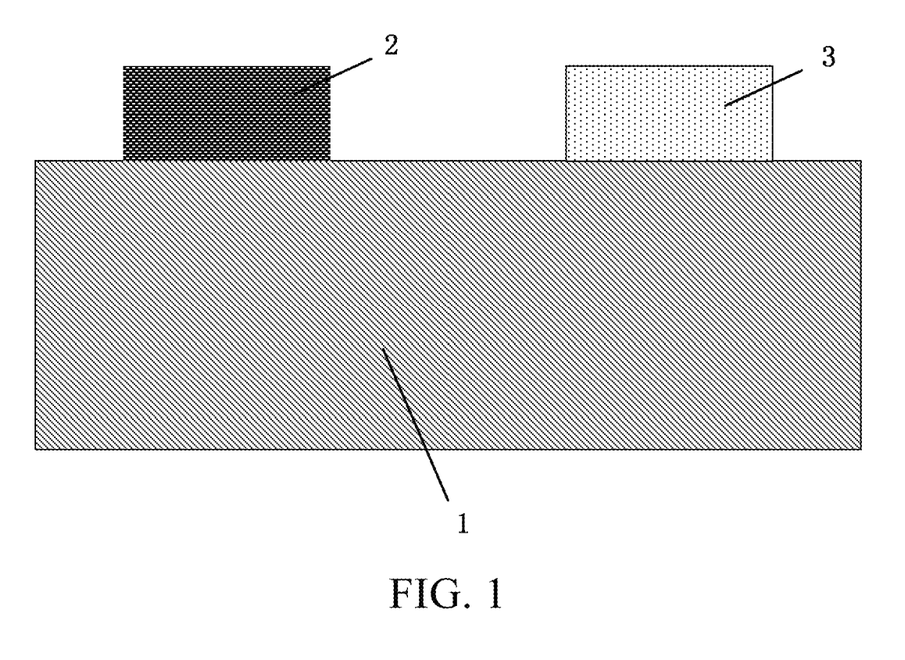
FIG. 1 is a schematic diagram of disposing a scattering bar in the prior art.

In an OPC process, usually, a target pattern and a scattering bar (SBar) are formed on the mask. As shown in FIG. 1, a patterned mask 2 is formed on a substrate 1, and a scattering bar 3 is also formed on the substrate 1, so as to implement OPC. However, this manner of disposing the scattering bar on the substrate may interfere with processing on a mask pattern, and therefore may cause a deposition loss, which further causes the mask to be scrapped and prolongs a correction time.

SUMMARY

The inventor of the present disclosure finds that the prior art has problems, and therefore provides a new technical solution for at least one of the problems.

One objective of the present disclosure is to provide a mask correction method. Another objective of the present disclosure is to provide a photolithography plate. A scattering bar is embedded in a substrate of the photolithography plate, so as to effectively avoid the impact of the scattering bar on a mask pattern, reduce a deposition loss, improve the correction effect, and shorten a correction time.

In a first aspect of the present disclosure, a mask correction method is provided, including the following steps: forming a patterned mask on a substrate; determining, according to the mask, a location of a scattering bar embedded in the substrate; forming an opening at the location; and embedding the scattering bar in the opening.

In some implementations, determining, according to the mask, a location of a scattering bar embedded in the substrate includes: performing optical imaging simulation on the mask to determine a mask pattern having a defect; and determining the location of the embedded scattering bar according to the mask pattern.

In some implementations, determining the location of the embedded scattering bar according to the mask pattern includes: determining whether a defect dimension of the mask pattern is within a specified range; and when the defect dimension is within the specified range, determining the location of the embedded scattering bar according to a shape of the mask pattern.

In some implementations, the specified range is 10 nm to 25 nm.

In some implementations, when the mask pattern is a long strip pattern, the location is located between the mask pattern and an adjacent mask pattern.

In some implementations, the location is located in the middle of the mask pattern and the adjacent mask pattern.

In some implementations, the location is located on a side that is of the mask pattern and on which the defect occurs.

In some implementations, when the mask pattern is a square pattern, the location is located inside the mask pattern.

In some implementations, the location is located at the center of the mask pattern.

In some implementations, forming an opening at the location includes performing etching down from an upper surface of the substrate to form the opening.

In another aspect of the present disclosure, a photolithography plate is provided. The photolithography plate may include: a substrate; a patterned mask located on the substrate; and a scattering bar embedded in the substrate.

In some implementations, when a mask pattern having a defect is a long strip pattern, an embedding location of the scattering bar is located between the mask pattern and an adjacent mask pattern.

In some implementations, the embedding location of the scattering bar is located in the middle of the mask pattern and the adjacent mask pattern.

In some implementations, the location is located on a side that is of the mask pattern and on which the defect occurs.

In some implementations, when a mask pattern having a defect is a square pattern, an embedding location of the scattering bar is located inside the mask pattern.

In some implementations, the embedding location of the scattering bar is located at the center of the mask pattern.

Other features and advantages of the present disclosure may become clear by describing exemplary embodiments and forms of the present disclosure in detail with reference to the following accompanying drawings.

BRIEF DESCRIPTION OF THE DRAWINGS

The accompanying drawings that constitute a part of the specification describe the embodiments and forms of the present disclosure, and are used to explain the principles of the present disclosure together with the specification.

The present disclosure may be more clearly understood with reference to the accompanying drawings and according to the following detailed description, where.

DETAILED DESCRIPTION

The following describes various exemplary embodiments and forms of the present disclosure in detail with reference to the accompanying drawings. It should be noted that, unless otherwise particularly specified, relative arrangements, numerical expressions, and values of parts and steps described in the embodiments and forms impose no limitation on the scope of the present disclosure.

Meanwhile, it should be understood that, for ease of description, dimensions of parts shown in the accompanying drawings are not drawn according to an actual proportion.

The following description about at least one exemplary embodiment or form is merely illustrative, and should not be construed as a limit to the present disclosure and its application or use.

For a person of ordinary skill in the art, known technologies, methods, and equipment may not be discussed in detail. However, the technology, method, and equipment should be regarded as a part of the authorized specification, where appropriate.

In all examples shown and discussed herein, any specific value should be explained to be merely exemplary, and not as a limitation. Therefore, in other examples of the exemplary embodiments or forms, different values may be provided.

It should be noted that, similar reference numeral and letters represent similar items in the following accompanying drawings. Therefore, once an item is defined in one accompanying drawing, the item does not need to be further discussed in subsequent accompanying drawings.

Figure 2:
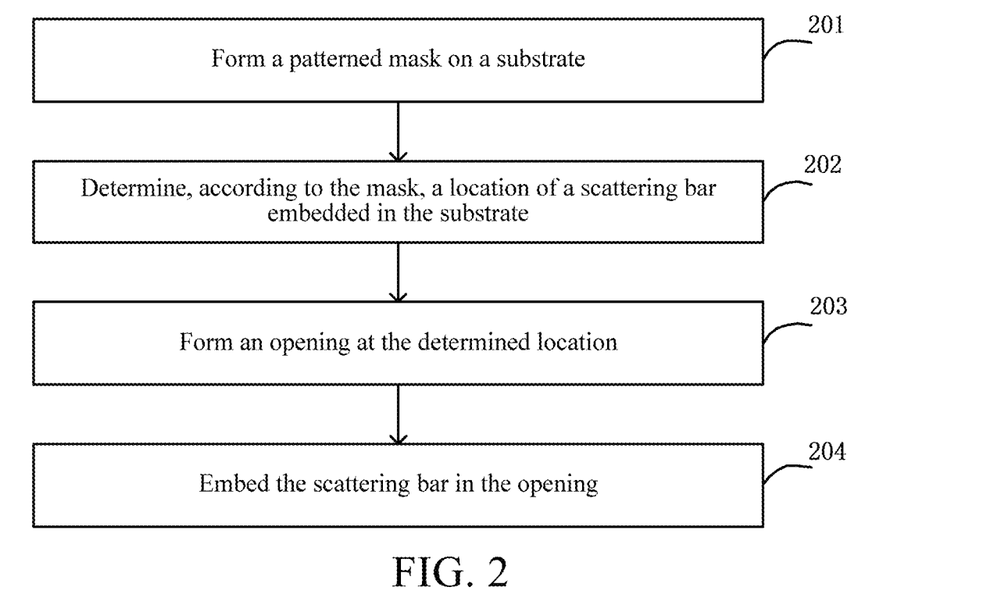
FIG. 2 is a schematic diagram that schematically illustrates a mask correction method according to some forms of the present disclosure.

FIG. 2 is a schematic diagram of a form of a mask correction method according to the present disclosure. As shown in FIG. 2, the method in this embodiment may include the following steps:

Step 201. Form a patterned mask on a substrate.

Step 202. Determine, according to the mask, a location of a scattering bar embedded in the substrate.

Optical imaging simulation may be performed on the mask to identify a mask pattern having a defect, and the location of the embedded scattering bar may be determined according to the mask pattern.

That is, optical imaging simulation may be performed on the mask, to determine which patterns in the mask may have a defect. The optical imaging simulation is known by a person skilled in the art, and therefore is not further described herein.

In some implementations, determining the location of the embedded scattering bar according to the mask pattern may include determining whether a defect dimension of the mask pattern is within a specified range. When the defect dimension is within the specified range, the location of the embedded scattering bar is determined according to a shape of the mask pattern. When the defect dimension goes beyond the specified range, no corresponding scattering bar correction processing needs to be performed. That is, the scattering bar does not need to be embedded in the substrate. In some implementations, the specified range is 10 nm to 25 nm.

The inventor finds through research that, if a defect value is less than 10 nm, an imaging result is always within the specified range. Therefore, no scattering bar correction processing needs to be performed. If a defect value is greater than 25 nm, even though scattering bar correction processing is performed, the correction effect is not significant.

In some implementations, when the mask pattern is a long strip pattern, the determined location may be located between the mask pattern and an adjacent mask pattern. In some implementations, the determined location may be located in the middle of the mask pattern and the adjacent mask pattern.

The determined location may be located on a side that is of mask pattern and on which the defect occurs to further improve the correction effect.

In some implementations, when the mask pattern is a square pattern, the location is located inside the mask pattern. In some implementations, the location may be located at the center of the mask pattern.

Step 203. Form an opening at the determined location.

In some implementations, etching is performed down from an upper surface of the substrate, to form the opening.

Step 204. Embed the scattering bar in the opening.

That is, related processing is performed in the opening to form a scattering bar.

In forms of the described mask correction method, a scattering bar is embedded in a substrate of a photolithography plate, so as to effectively avoid the impact of the scattering bar on a mask pattern, reduce a deposition loss, and shorten a correction time.

The following describes implementations of the present disclosure using specific examples.

Figure 3A:
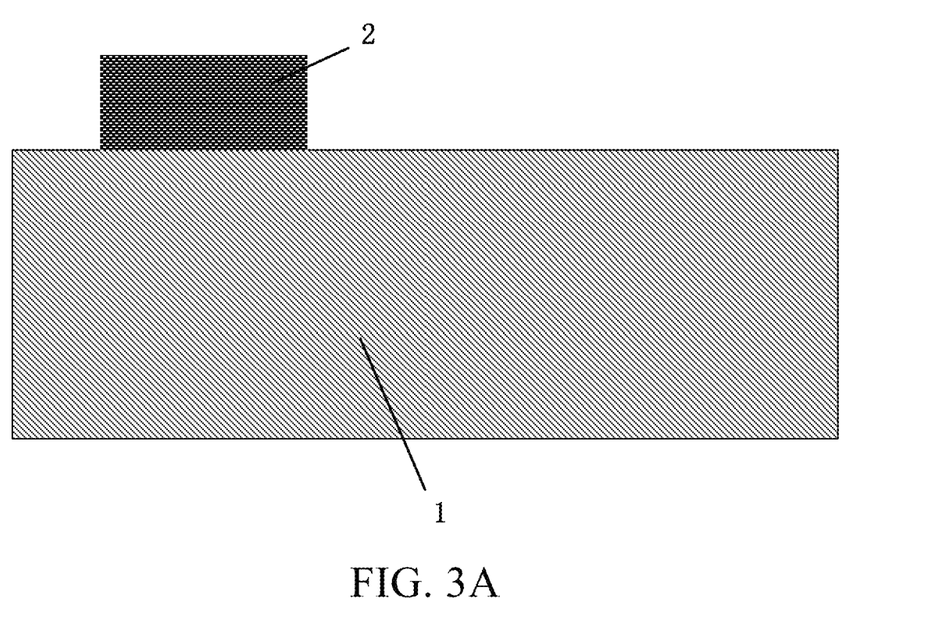
FIG. 3A to FIG. 3C each are a schematic structural diagram that schematically illustrates a phase in a manufacturing process of a photolithography plate according to some forms of the present disclosure.

As shown in FIG. 3A, a patterned mask 2 is formed on a quartz substrate 1.

Figure 3B:
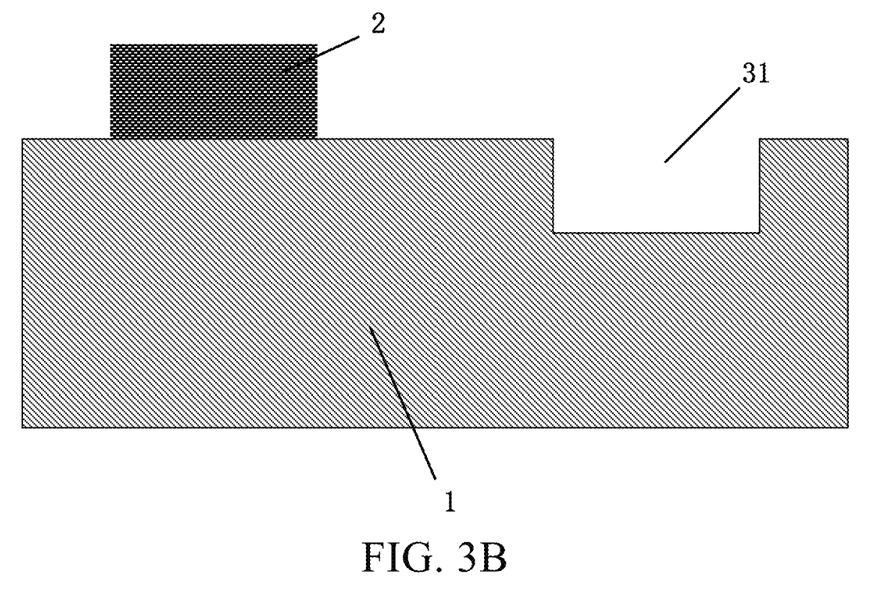

As shown in FIG. 3B, optical imaging simulation is performed on the mask 2 to identify a mask pattern having a defect, and a location of an embedded scattering bar is determined according to the mask pattern, so as to form an opening 31 at the determined location.

In some implementations, etching is performed down from an upper surface of the substrate 1 to form the opening 31.

Figure 3C:
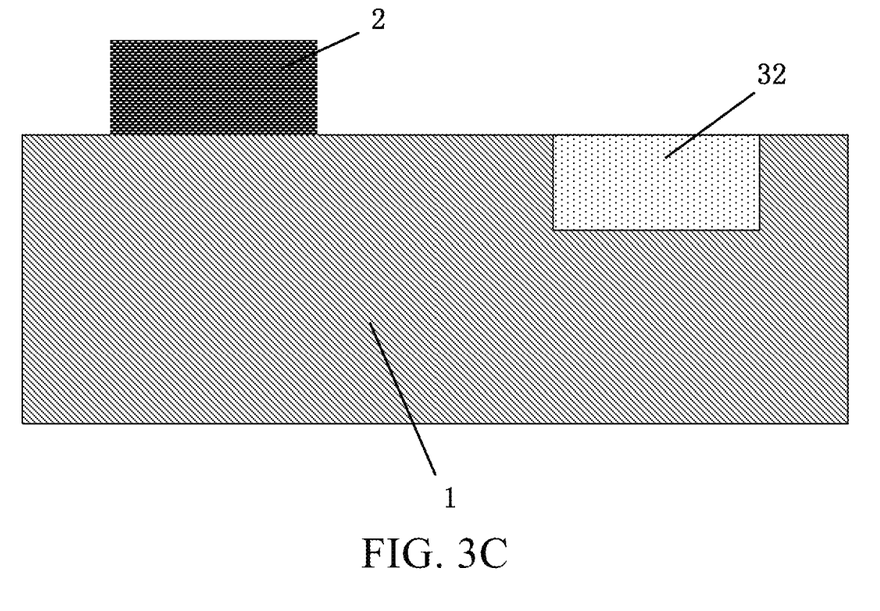

As shown in FIG. 3C, a scattering bar 32 is formed in the opening 31.

When the location of the embedded scattering bar is determined according to the mask pattern, if the mask pattern is a long strip pattern, the determined location may be located in the middle of the mask pattern and an adjacent mask pattern.

Figure 4:
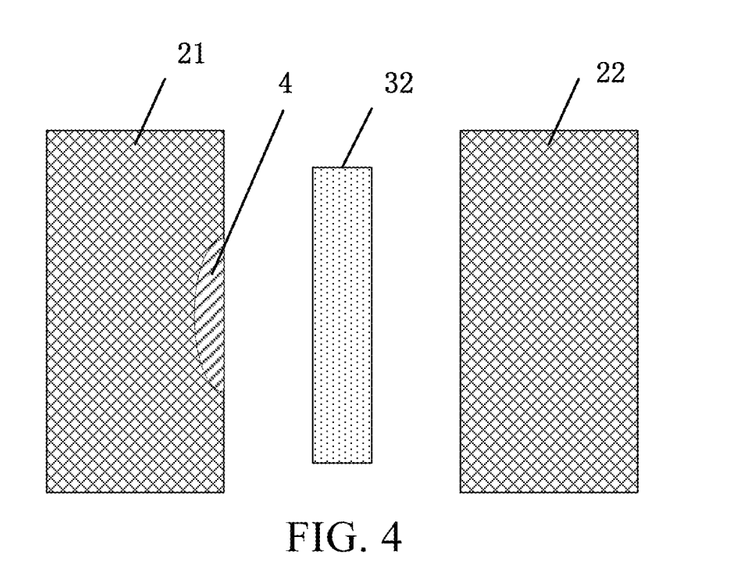
FIG. 4 is a schematic diagram that schematically illustrates location selection of a scattering bar according to some forms of the present disclosure.

As shown in FIG. 4, the mask pattern is in a shape of a long strip. After optical imaging simulation is performed, if it is found that a mask pattern 21 has a defect, the location of the embedded scattering bar 32 is disposed between the mask pattern 21 and a mask pattern 22 adjacent to the mask pattern 21. In some implementations, the location may be located in the middle of the mask pattern 21 and the mask pattern 22 adjacent to the mask pattern 21.

In some implementations, considering that a defect 4 may occur on a right side of the mask pattern 21, the location of the embedded scattering bar 32 may be disposed on the right side of the mask pattern 21 to further improve the correction effect.

Through testing, the defect 4 may occur on the right side of the mask pattern 21, and the location of the embedded scattering bar 32 is disposed in the middle of the mask pattern 21 and the mask pattern 22 adjacent to the right side of the mask pattern 21, as shown in FIG. 4. In this case, surrounding imaging is most stable.

Figure 5A:
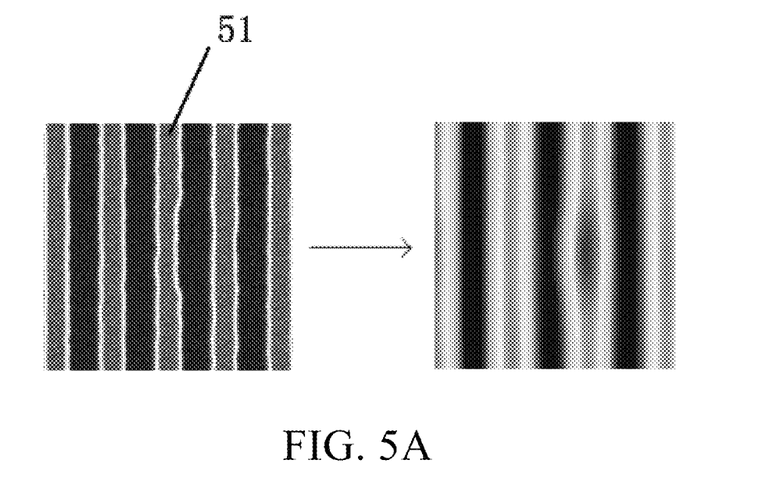
FIG. 5A and FIG. 5B both are a schematic diagram that schematically illustrates an optical imaging result obtained by wafer simulation according to some forms of the present disclosure.
Figure 5B:
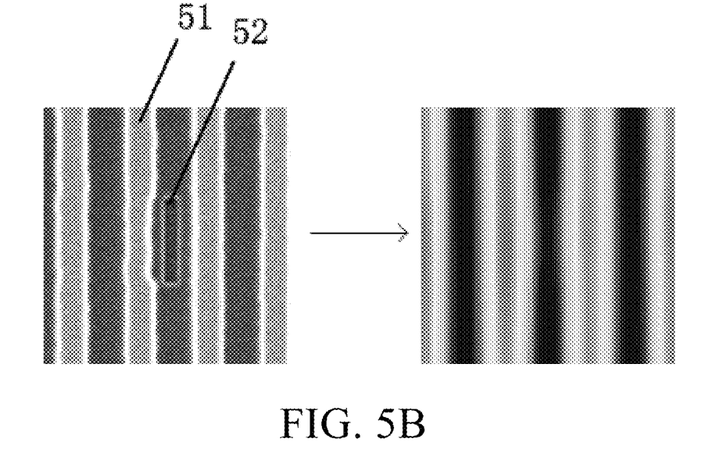

FIG. 5A and FIG. 5B show a specific example. When the mask pattern is a long strip pattern, because a mask pattern 51 has a defect, an obtained optical imaging result obtained by wafer simulation is affected, as shown in FIG. 5A.

However, in FIG. 5B, for a case in which the right side of the mask pattern 51 has a defect, a scattering bar 52 is embedded in a substrate and in the middle of the mask pattern 51 and a mask pattern at the right side of the mask pattern 51, so as to alleviate the impact of the defect on the optical imaging result obtained by wafer simulation.

It should be noted that, for the optical imaging result obtained by wafer simulation, if the result is 100%, it indicates that the optical imaging result obtained by wafer simulation is perfectly matched. In some implementations, an acceptable range is between 90% and 110%.

In FIG. 5A, the optical imaging result obtained by wafer simulation is 118%, and after the scattering bar is embedded by using the solutions provided in the present disclosure, the optical imaging result obtained by wafer simulation in FIG. 5B is 105%. According to the solutions provided in the present disclosure, the impact of the defect of the mask pattern on the optical imaging result obtained by wafer simulation is greatly alleviated.

In addition, when the mask pattern is a square pattern, the determined location may be located at the center of the mask pattern.

Figure 6:
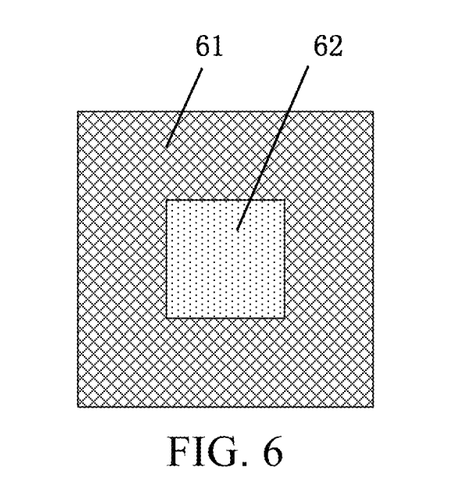
FIG. 6 is a schematic diagram that schematically illustrates location selection of a scattering bar according to some forms of the present disclosure.

As shown in FIG. 6, the mask pattern is in a shape of a long strip. After optical imaging simulation is performed, if it is found that a mask pattern 61 has a defect, a location of an embedded scattering bar 62 is disposed inside the mask pattern 61. In some implementations, the location may be disposed at the center of the mask pattern 61.

Figure 7A:
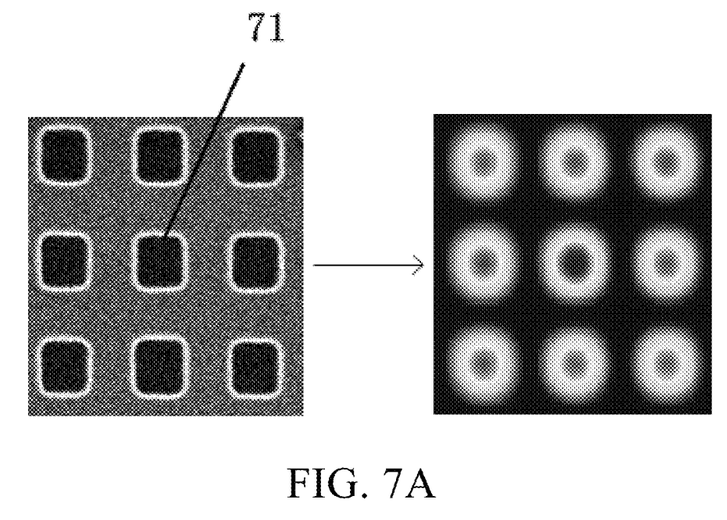
FIG. 7A and FIG. 7B both are a schematic diagram that schematically illustrates an optical imaging result obtained by wafer simulation according to some forms of the present disclosure.
Figure 7B:
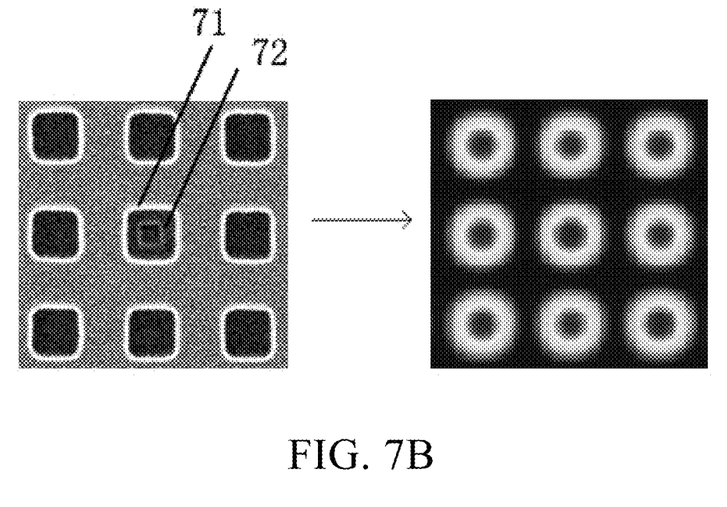

FIG. 7A and FIG. 7B show a specific example. When the mask pattern is a long strip pattern, because a mask pattern 71 has a defect, an optical imaging result obtained by wafer simulation is affected, as shown in FIG. 7A.

However, in FIG. 7B, for a case in which the mask pattern 71 that has a defect, a scattering bar 72 is embedded in a substrate and at the center of the mask pattern 71, so as to alleviate the impact of the defect on the optical imaging result obtained by wafer simulation.

It is known through calculation that, in FIG. 7A, the optical imaging result obtained by wafer simulation is 114%, and after the scattering bar is embedded by using the solutions provided in the present disclosure, the optical imaging result obtained by wafer simulation in FIG. 7B is 97%. According to the solutions provided in the present disclosure, the impact of the defect of the mask pattern on the optical imaging result obtained by wafer simulation is greatly alleviated.

Herein, it should be noted that, when a defect value of the mask pattern is less than 10 nm, an imaging result is always within the specified range. Therefore, no scattering bar correction processing needs to be performed. If a defect value is greater than 25 nm, even though scattering bar correction processing is performed, the correction effect is not significant. Therefore, before the processing is performed, a defect dimension of the mask pattern needs to be determined first. Only when the defect dimension of the mask pattern is within the specified range (that is, 10 nm to 25 nm), the embedding location of the scattering bar on the substrate can be determined according to the solution provided in the present invention.

The present disclosure further discloses a photolithography plate, as shown in FIG. 3C. The photolithography plate includes, a substrate 1, a patterned mask 2 located on the substrate 1, and a scattering bar 32 embedded in the substrate 1.

When a mask pattern having a defect is a long strip pattern, an embedding location of the scattering bar is located between the mask pattern and an adjacent mask pattern. In some implementations, the embedding location of the scattering bar is located in the middle of the mask pattern and the adjacent mask pattern.

In some implementations, the determined location is located on a side that is of the mask pattern and on which the defect occurs, as shown in FIG. 4.

In addition, when a mask pattern having a defect is a square pattern, an embedding location of the scattering bar is located inside the mask pattern. In some implementations, the embedding location of the scattering bar is located at the center of the mask pattern, as shown in FIG. 6.

In forms of the present disclosure, a scattering bar is embedded in a substrate of a photolithography plate, so as to effectively avoid the impact of the scattering bar on a mask pattern, reduce a deposition loss, improve the correction effect, and shorten a correction time.

Above, semiconductor device manufacturing methods and formed semiconductor devices according to the present disclosure have been described in detail. To avoid ostructing the concepts of the present disclosure, some details known in the art are not described. A person skilled in the art can understand, according to the foregoing description, how to implement the technical solution disclosed herein.

Although some particular embodiments and implementations of the present disclosure have been described in detail using examples, a person skilled in the art should understand that the foregoing examples are merely for illustration, and are not intended to limit the scope of the present disclosure. A person skilled in the art should understand that the foregoing embodiments and forms may be modified without departing from the scope and spirit of the present invention. The scope of the present disclosure is subject to the appended claims.

What is claimed is:

1. A mask correction method, comprising:
    forming a patterned mask having at least one defect with a defect dimension of 10 nm to 25 nm on a substrate;
    performing optical imaging simulation on the mask to determine a defective mask pattern within the patterned mask;
    determining whether the defect dimension of the defect on the defective mask pattern is within a specified range, where the specified range is 10 nm to 25 nm; and in response to determining that the defect dimension is within the specified range,     determining a location of a scattering bar to be formed in the substrate according to a shape of the defective mask pattern,     forming a recess at the location in the substrate, and     forming the scattering bar in the recess, where a length of the scattering bar is greater than a length of the defect and a width of the scattering bar is greater than a width of the defect.

2. The method according to claim 1, wherein, when the defective mask pattern is a long strip pattern, the location is located between the defective mask pattern and an adjacent mask pattern.

3. The method according to claim 2, wherein the location is located in the middle of the defective mask pattern and the adjacent mask pattern.

4. The method according to claim 2, wherein the location is located on a side that is of the defective mask pattern and on which the defect occurs.

5. The method according to claim 1, wherein, when the defective mask pattern is a square pattern, the location is located inside the defective mask pattern.

6. The method according to claim 5, wherein the location is located at the center of the defective mask pattern.

7. The method according to claim 1, wherein forming the recess at the location comprises:

performing etching down from an upper surface of the substrate to form the recess.

\* \* \* \* \*